US006177333B1

(12) United States Patent
Rhodes

(10) Patent No.: US 6,177,333 B1
(45) Date of Patent: Jan. 23, 2001

(54) METHOD FOR MAKING A TRENCH ISOLATION FOR SEMICONDUCTOR DEVICES

(75) Inventor: Howard E. Rhodes, Boise, ID (US)

(73) Assignee: Micron Technology, Inc., Boise, ID (US)

(*) Notice: Under 35 U.S.C. 154(b), the term of this patent shall be extended for 0 days.

(21) Appl. No.: 09/231,176

(22) Filed: Jan. 14, 1999

(51) Int. Cl.$^7$ ................................................ H01L 21/76
(52) U.S. Cl. ...................... 438/433; 438/424; 438/296; 438/221
(58) Field of Search ................................. 438/221, 296, 438/424, 433

(56) References Cited

U.S. PATENT DOCUMENTS

| | | |
|---|---|---|
| 5,250,450 | 10/1993 | Lee et al. . |
| 5,397,908 | 3/1995 | Dennison et al. . |
| 5,433,794 | 7/1995 | Fazan et al. . |
| 5,492,853 | 2/1996 | Jeng et al. . |
| 5,693,971 | 12/1997 | Gonzalez . |
| 5,702,976 | 12/1997 | Schuegraf et al. . |
| 5,763,309 * | 6/1998 | Chang ................................. 438/262 |
| 5,770,504 * | 6/1998 | Brown et al. ........................ 438/433 |
| 5,891,787 * | 4/1999 | Gardner et al. ...................... 438/424 |
| 5,960,298 * | 9/1999 | Kim ..................................... 438/424 |
| 6,069,057 * | 5/2000 | Wu ....................................... 438/433 |

OTHER PUBLICATIONS

S. Nag et al., "Comparative Evaluation of Gap–Fill Dielectrics in Shallow Trench Isolation for Sub–0.25μm Technologies", IEEE 1996, pp. 841–844.

S. Mendis et al., "Procgress In CMOS Active Pixel Image Sensors", SPIE vol. 2172, pp. 19–29 No Date.

S.B. Campana, "Techniques for Evaluating Charge Coupled Imagers", Optical Engineering, May–Jun. 1977, vol. 16, No. 3, pp. 167–274.

S. Mendis et al., "CMOS Active Pixel Image Sensors for Highly Integrated Imaging Systems", IEEE 1997, pp. 187–197.

S. Mendis et al., "A 128×128 CMOS Active Pixel Image Sensor for Highly Integrated Imaging Systems", IEEE 1993, pp. 583–586.

* cited by examiner

Primary Examiner—Charles Bowers
Assistant Examiner—David S Blum
(74) Attorney, Agent, or Firm—Dickstein Shapiro Morin & Oshinsky, LLP

(57) ABSTRACT

A method of fabricating an integrated circuit includes forming an isolation trench in a semiconductor substrate and partially filling the trench with a dielectric material so that at least the sidewalls of the trench are coated with the dielectric material. Ions are implanted into the substrate in regions directly below the isolation trench after partially filling the trench with the dielectric material. The dielectric along the sidewalls of the trenches can serve as a mask so that substantially all of the ions implanted below the isolation trenches are displaced from the active regions. The dielectric along the sidewalls of the trenches serves as a mask so that substantially all of the ions implanted below the isolation trenches are displaced from the active regions. After the ions are implanted in the substrate below the trenches, the remainder of the trench can be filled with the same or another dielectric material. The trench isolation technique can be used to fabricate memory, logic and imager devices which can exhibit reduced current leakage and/or reduced optical cross-talk.

41 Claims, 6 Drawing Sheets

METHOD FOR MAKING A TRENCH ISOLATION FOR SEMICONDUCTOR DEVICES

BACKGROUND

The present invention relates generally to semiconductor devices and, more particularly, to trench isolation process technology for use in memory, image, logic and other semiconductor devices.

Implementing electronic circuits involves connecting isolated devices or circuit components through specific electronic paths. In silicon integrated circuit (IC) fabrication, it is necessary to isolate devices that are formed in a single substrate from one another. The individual devices or circuit components subsequently are interconnected to create a specific circuit configuration.

As the density of the devices continues to rise, parasitic inter-device currents become more problematic. Isolation technology, therefore, has become a critical aspect of integrated circuit fabrication.

For example, dynamic random access memory (DRAM) devices generally comprise an array of memory cells for storing data and peripheral circuits for controlling data in the memory cells. Each memory cell in a DRAM stores one bit of data and consists of one transistor and one capacitor. Within the array, each memory cell must be electrically isolated from adjacent memory cells. The degree to which large numbers of memory cells can be integrated into a single IC chip depends, among other things, on the degree of isolation between the memory cells.

Similarly, in metal-oxide-semiconductor (MOS) technology, isolation must be provided between adjacent devices, such as NMOS or PMOS transistors or CMOS circuits, to prevent parasitic channel formation. CMOS circuits can be used, for example, to form the pixels in a photosensitive imaging device and must be isolated from one another. In the case of CCD or CMOS imagers which are intentionally fabricated to be sensitive to light, it is advantageous to provide both electrical and optical isolation between pixels.

Shallow trench isolation (STI) is one technique which can be used to isolate devices such as memory cells or pixels from one another. In general, a trench is etched into the substrate to provide a physical barrier between adjacent devices. Refilled trench structures, for example, consist essentially of a sub-micron recess formed in the silicon substrate by a dry anisotropic or other etching process. The recess is filled with a dielectric such as a chemical vapor deposited (CVD) silicon dioxide ($SiO_2$). The filled trench then is planarized by an etchback process so that the dielectric remains only in the trench and its top surface level with that of the silicon substrate.

Refilled trench isolation is sometimes categorized according to the dimensions of the trench: shallow trenches (less than about 1 micron), moderate depth trenches (1–3 microns), and deep narrow trenches (greater than 3 microns deep, less than 2 microns wide). Shallow trench isolation is used, for example, to isolate devices.

To enhance the isolation further, ions can be implanted in the silicon substrate in the area directly beneath the trench. However, as noted, for example, in S. Nag et al., "Comparative Evaluation of Gap-Fill Dielectrics in Shallow Trench Isolation for Sub-0.25 µm Technologies," IEEE IEDM, pp. 841–844 (1996), some ion implants can result in high current leakage. In particular, when ions are implanted in the substrate close to the edges of the trench, current leakage can occur at the junction between the active device regions and the trench. Similarly, if the trench is shallow, then a photon impinging on a particular pixel of a photosensitive device may diffuse under the trench isolation structure to an adjacent pixel, resulting in detection of the photon by the wrong pixel. Accordingly, it is desirable to improve the trench isolation techniques to address those and similar problems.

SUMMARY

In general, according to one aspect, a method of fabricating an integrated circuit includes forming an isolation trench having a bottom and sidewalls in a semiconductor substrate and partially filling the trench with a dielectric material so that at least the sidewalls of the trench are coated with the dielectric material. Ions are implanted into the substrate in regions directly below the isolation trench after partially filling the trench with the dielectric material.

The dielectric along the sidewalls of the trenches can serve as a mask so that substantially all of the ions implanted below the isolation trenches are displaced from the active regions. After the ions are implanted in the substrate below the trenches, the remainder of the trench can be filled with the same or another dielectric material.

Various implementations include one or more of the following features. In general, the energy of the ions and the thickness of the dielectric layer can be selected so that the dielectric layer along the sidewalls of the trench serves as a mask that prevents ions from becoming implanted in the substrate in a vicinity near edges of the trenches. Depending on the particular application, shallow and/or deep ion profiles can be implanted into the substrate.

Partially filling the trench with a dielectric material can include growing an oxide layer such as silicon dioxide or depositing an insulating material using chemical vapor deposition or a combination of thermal growth and chemical vapor deposition. Preferably, the dielectric layer has a sidewall thickness less than about forty percent the width of the trench.

The trench isolation technique can be used to fabricate a variety of integrated circuits which can include devices that exhibit reduced current leakage and/or reduced optical cross-talk. Integrated circuits including imaging devices, such as CMOS imagers and CCD imagers, memory devices, such as DRAMs, and logic devices are representative of devices that can be formed according to the invention. More generally, the techniques described by this invention can be used to provide isolation for an active region on any semiconductor device. Impurity-doped regions can be formed in the active regions and may include, for example, storage nodes for a memory device, photosensitive elements for an imaging device, or active elements for a logic device, as well as others active semiconductor elements.

In some implementations, shallow ion implants are provided to establish field threshold voltage implants to improve the electrical isolation between active areas. Deep implants can be provided, for example, to reduce the optical cross-talk between adjacent photosensitive pixels in CMOS or CCD imagers.

Other features and advantages will be readily apparent from the following detailed description, the accompanying drawings, and the claims.

DETAILED DESCRIPTION

Figure 1:
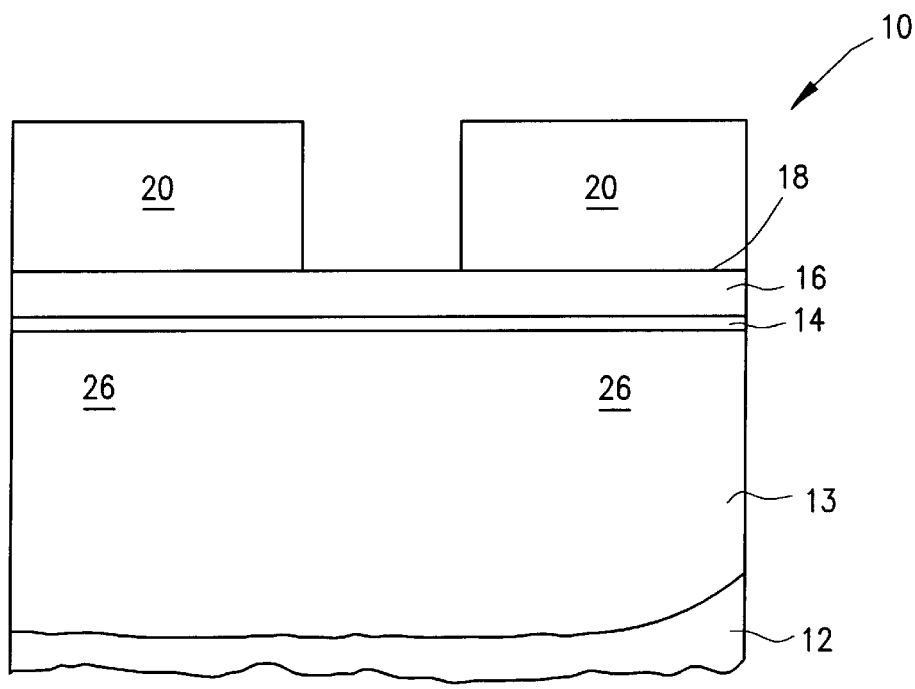
FIG. 1 is a cross-section of an exemplary semiconductor device with a photolithographic mask for the formation of trench isolation regions.

Referring to FIG. 1, a silicon or other semiconductor wafer 10 includes a bulk substrate region 12. Typically, ions are implanted in the substrate 12 to form n-type wells and p-type wells which define the locations of the n-channel and p-channel devices 26. For example, the substrate 12 can be implanted with a p-type dopant such as boron (B) to form a p-well 13. For ease of illustration, the figures show active areas and STI field isolation regions in a single well type. However, in general, the invention is applicable to other semiconductor device isolation regions such as n-well and p-well regions in p-type substrates, n-type substrates and epitaxial substrates, including p on p+, p on p−, n on n+, and n on n−. In some implementations, the substrate 12 can comprise gallium arsenide (GaAs) or other semiconductor materials such as InP, CdS, CdTe and the like.

A layer of pad oxide 14 is provided atop the substrate 12, for example, either by deposition or by oxidizing conditions. A sacrificial layer 16 such as $Si_3N_4$ is provided over the pad oxide layer 14 and defines an outer surface 18. A mask 20, such as a layer of photoresist, then is deposited and patterned as shown. The mask 20 can be patterned by conventional photolithographic techniques.

Figure 2:
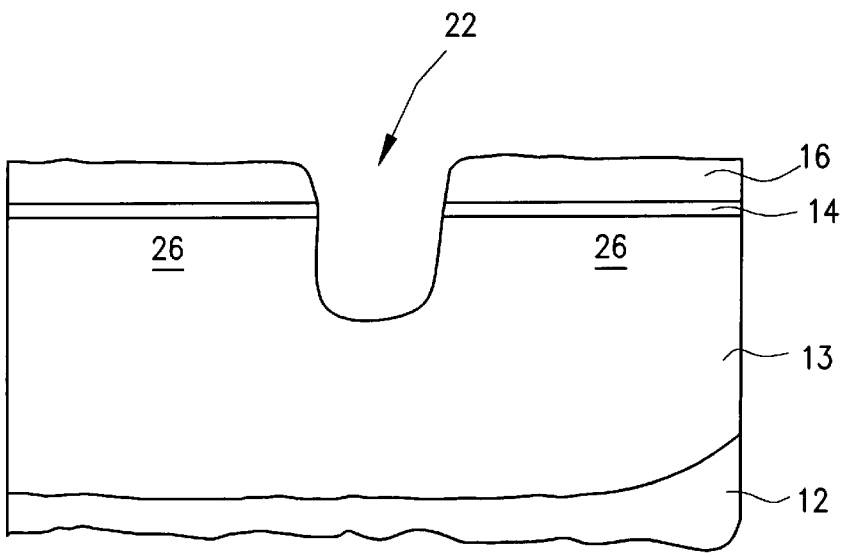
FIG. 2 is a cross-section of the device with isolation trenches formed therein.

Referring to FIG. 2, the sacrificial layer 16 and the pad oxide layer 14 are etched by a dry etch process. The etch process is allowed to continue into the substrate 12 to form one or more trenches 22. In one implementation, the trenches 22 extend into the substrate 12 to a depth of about 1,000 to about 8,000 Å. An anisotropic etch such as a plasma or reactive ion etch (RIE) process can be used as the dry etch. The mask 20 then is removed by wet or dry stripping of the photoresist.

Figure 3:
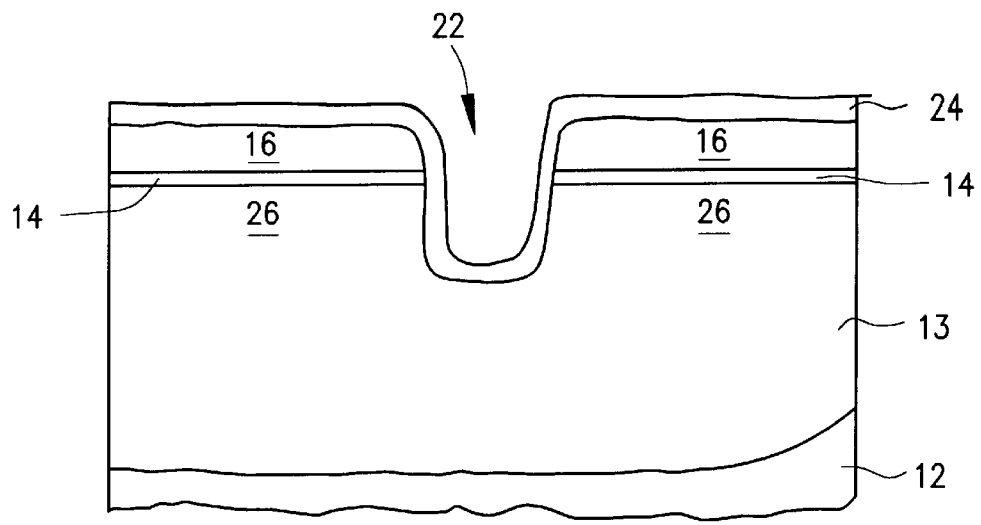
FIG. 3 is a cross-section of the device after the trenches have been partially-filled with a dielectric according to the invention.

Next, referring to FIG. 3, the trenches 22 are partially filled with a dielectric material 24. Suitable dielectric materials include oxides such as silicon oxide ($SiO_2$). The oxide can be formed by thermally growing a thin layer of $SiO_2$ over exposed areas of the substrate and subsequently depositing another layer of $SiO_2$ by a chemical vapor deposition (CVD) technique. The thermally-grown oxide layer serves to pacify the silicon surfaces of the bulk substrate 12 from the subsequently deposited CVD oxide.

According to one embodiment, the dielectric layer 24 is substantially conformal. In other words, the thickness of the dielectric layer 24 is substantially the same along the sides and at the bottom of the trenches 22, as well as above the active regions 26 of the device. For example, using trenches 22 having a width of about 3,000 Å and a depth of about 3,500 Å into the substrate 12, an oxide 24 having a thickness of about 100 to about 1,200 Å can be provided. The width of the gap that exists between opposite walls 28 of the trench 22 after the oxide 24 has been grown is, therefore, about 600 to about 2,800 Å. In general, the thickness of the oxide layer 24 along the sidewalls 28 should be at least about 100 Å. In general, the thickness of the oxide 24 along the sidewalls 28 should not be greater than about forty percent the original width of the trench 22.

Figure 4:
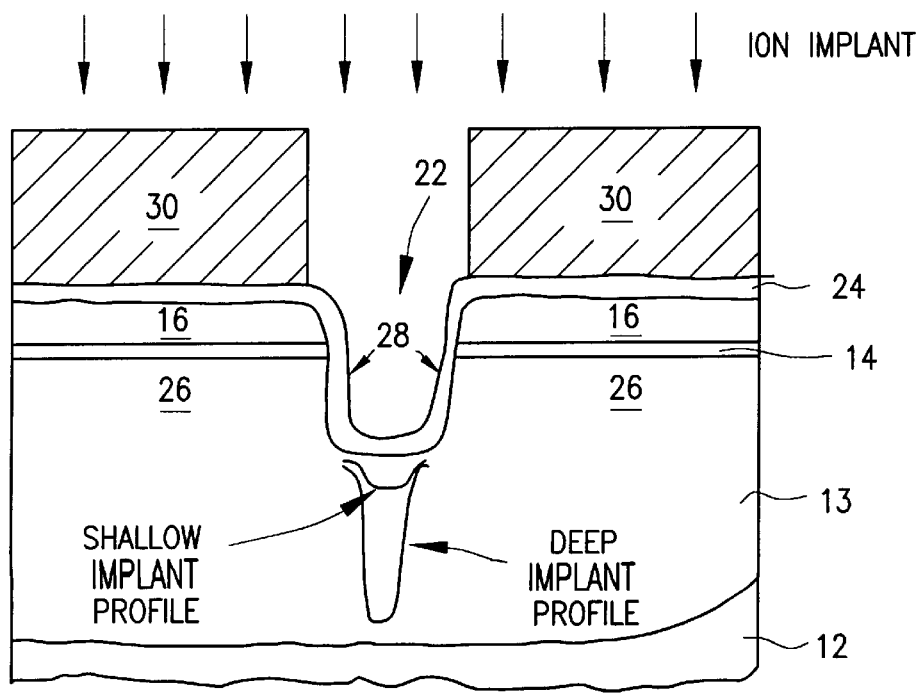
FIG. 4 is a cross-section of the device during an ion implant according to the invention.

Once the trenches 22 have been partially filled with the dielectric 24, a masked ion implant is performed to implant ions in the areas of the substrate 22 directly beneath the trenches 22 as shown in FIG. 4. For example, in the case of a p-type substrate 12 with p-wells, p-type ions such as boron (B) can be implanted in the substrate using a photoresist mask 30. Similarly, in the case of a p-type substrate 12 with n-wells, n-type ions such as phosphorous (P), arsenic (As) or antimony (Sb) can be implanted.

Performing the isolation ion implant while the trenches 22 are only partially filled with an oxide or other dielectric 24 allows the oxide along the trench walls 28 to serve as a mask that prevents the ions from becoming implanted in the substrate near the edges of the trenches. Thus, an implanted ion profile can be obtained so that the implanted ions are displaced from the sidewall edges of the trench 22 by a distance approximately equal to the sidewall thickness of the dielectric layer 24. In particular, shallow and/or deep ion implants which are self-aligned to the edge of the active regions 26 can be obtained. The actual profiles may differ from those illustrated in the drawings.

A shallow implant, in other words, an implant with ion energies just high enough to pass through the dielectric layer 24 at the bottom of the trench 22, is advantageous because it is self-aligned to the trench edge and it is spaced away from the trench edge. Such a shallow implant can be effective as a field threshold voltage ($V_t$) implant to improve the electrical isolation between active areas separated by the trench isolation regions. In contrast to existing STI processes, which suffer from leakage from the active areas to the substrate, the present technique, in which the field implant is spaced away from the STI trench edge and the subsequently-formed active areas, creates a reduced doping profile at the trench edge. The reduced doping profile can result in a reduced electric field and reduced leakage.

Alternatively, or in addition, a deep ion implant can be formed beneath the trench 22 with the implant having a depth at least as great as the depth of the dielectric layer 24. The range of such a deep implant can approach the depth of the STI trench. Preferably, the depth of the ion implant below the trench 22 should not be greater than the combined thicknesses of the pad oxide layer 14 and the sacrificial layer 16 plus the depth of the trench 22. More generally, the depth of the deep ion implant into the substrate should be in the range of about 10 to 100 percent the depth of the trench. Preferably, the ions are implanted to a depth in the range of about 20 to 80 percent the depth of the trench. The deep implant can be spaced away from the trench edge to reduce the leakage from the active areas to the substrate. A deep implant can form a deep isolation region without added substrate leakage which is advantageous for applications such as CCD and CMOS imagers. In those applications, absorption of long wavelength light occurs deep in the photosensitive pixels thereby creating photo-generated carriers deep in the silicon that can diffuse to neighboring pixels. The presence of the deep field implant between pixels serves to collect the photo-generated electrons and thereby prevent them from being collected at a neighboring pixel site. The deep implant can, therefore, reduce optical crosstalk and help preserve the fidelity of the image obtained by the imager.

Figure 5:
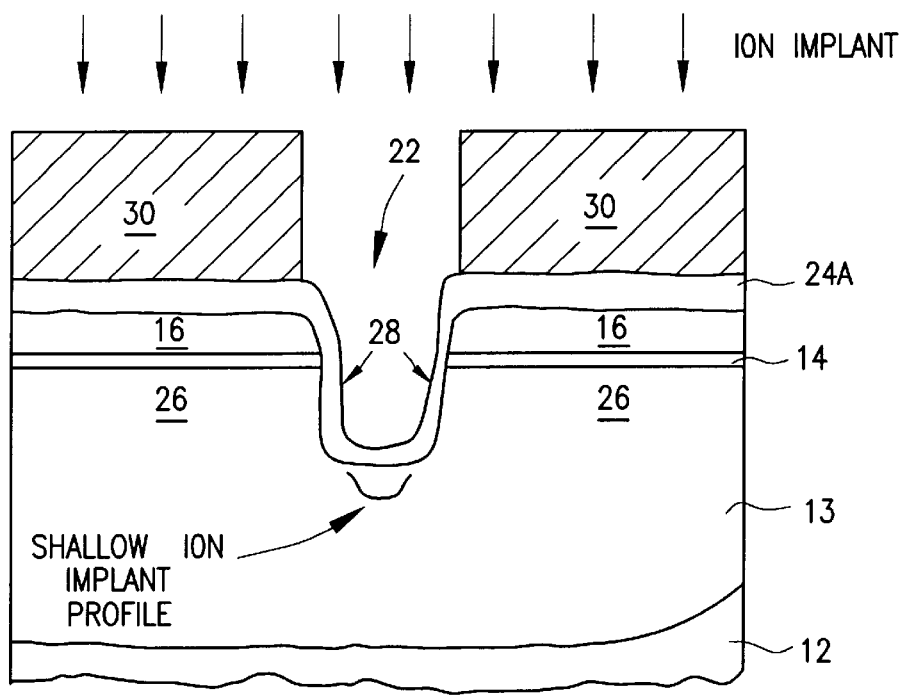
FIG. 5 is a cross-section of the device during an ion implant according to another embodiment of the invention.

In an alternative embodiment illustrated in FIG. 5, an oxide or other dielectric layer 24A with poor conformality partially fills the trenches 22. In particular, a relatively thick $SiO_2$ layer can be grown above the active regions 26 whereas a relatively thin $SiO_2$ layer is grown along the walls 28 and bottom of each trench. For example, the thick oxide layer 24A above the active regions 26 can be about two to four times as thick as the oxide in the trenches. As before, the oxide layer 24A along the walls 28 of the trenches 22 can serve as a mask that prevents the ions from becoming implanted in the substrate in the vicinity near the edges of the trenches, and an implanted ion profile can be obtained so that most of the implanted ions are displaced from the active regions 26 of the device 10. A shallow boron or other ion implant can then be performed with self-alignment to the edges of the active regions 26. Performing a shallow isolation ion implant while the trenches 22 are only partially-filled with a dielectric having poor conformality can be advantageous, for example, in the fabrication of DRAMs.

Figure 6:
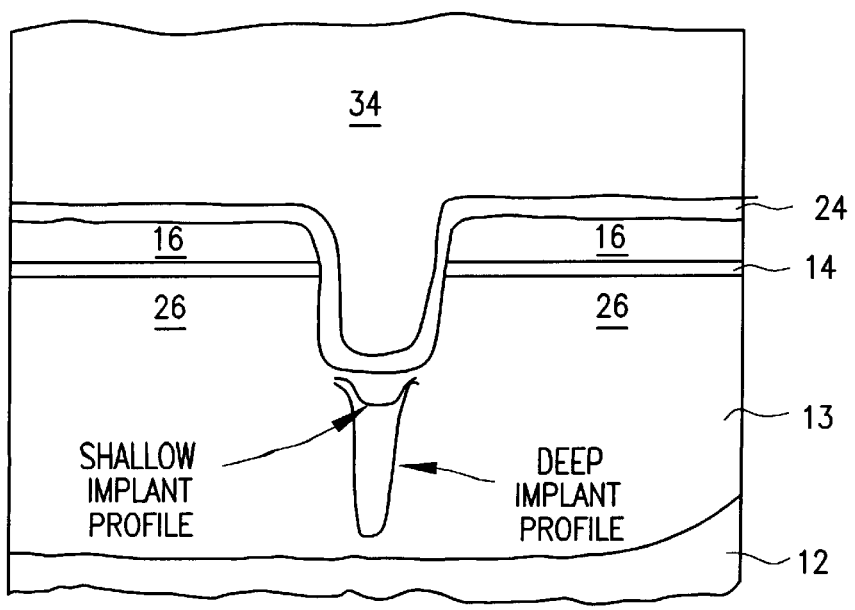
FIG. 6 is a cross-section of the device after the trenches have been completely filled according to the invention.

Once the ions are implanted beneath the partially-filled trenches 22 as shown, for example, in FIG. 4, a CVD oxide 34 is deposited to fill the trenches completely as shown in FIG. 6. After deposition of the CVD oxide 34, an anneal process can be performed to densify the oxide prior to CMP planarization. The anneal process also serves to activate the field implants.

Figure 7:
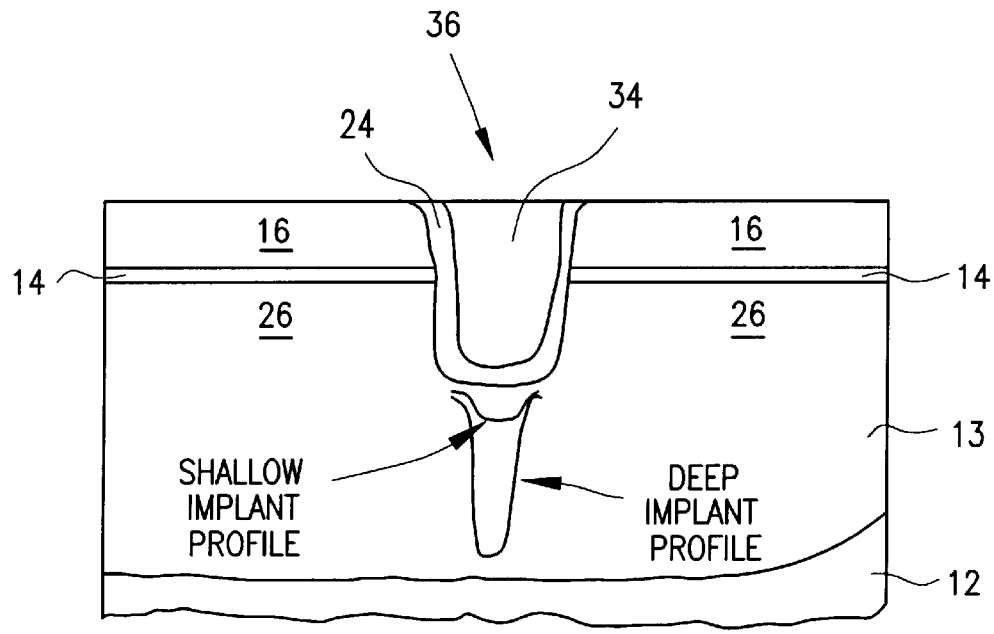
FIGS. 7–8 illustrate subsequent acts in the fabrication process of the device.
Figure 8:
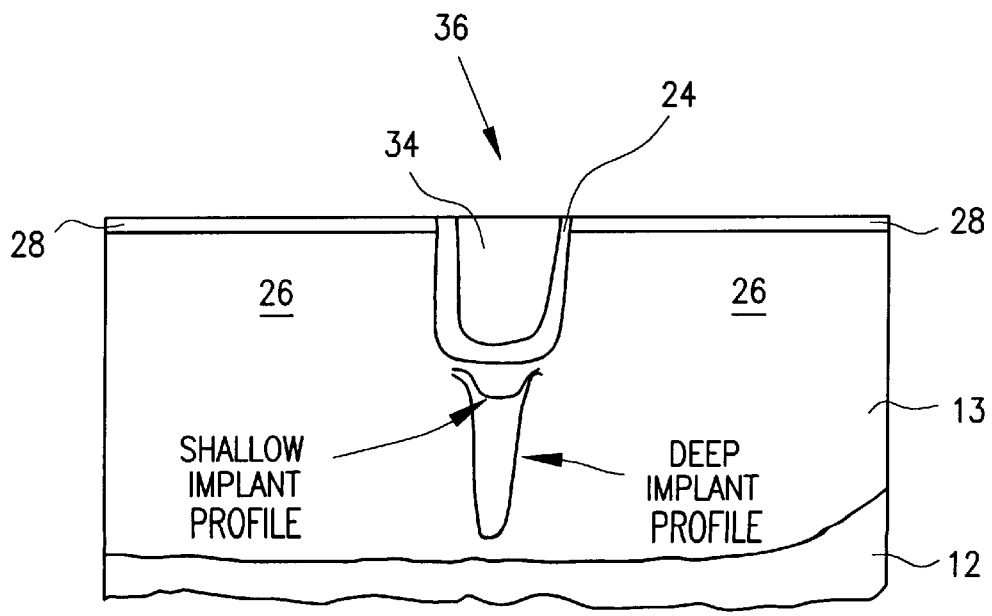

Subsequently, the top surface of the device is planarized by an etchback process which can include, for example, a chemical-mechanical polish (CMP). The top surface is etched at least to the sacrificial layer 16 to form a field isolation region 36 as shown in FIG. 7. Remaining portions of the sacrificial layer 16 are etched from the substrate. For example, if the sacrificial layer 16 comprises silicon nitride ($Si_3N_4$), phosphoric acid ($H_3PO_4$) can be used for the etch. The previously-formed oxide layer 14 is stripped and a new oxide layer 38 is grown as a gate oxide (FIG. 8). Alternatively, the oxide layer 14 can be stripped and a new sacrificial oxide layer grown. The ions would then be implanted through the new sacrificial layer which subsequently is stripped or removed. The new gate oxide 38 then can be grown.

Additional processes can be performed using known techniques to complete an integrated circuit (IC) that includes active semiconductor regions separated by the isolation regions 36. Various types of devices can be formed in the active areas. Such devices include imaging devices, memory devices or logic devices. For example, the completed IC can include an array of light sensitive pixels for a CMOS or CCD imager, or an array of memory cells for a DRAM or other memory device. In other ICs, logic devices for gate arrays, microprocessors or digital signal processors can be formed in the active regions. The field isolation regions 36 can separate the active regions from one another.

Figure 9:
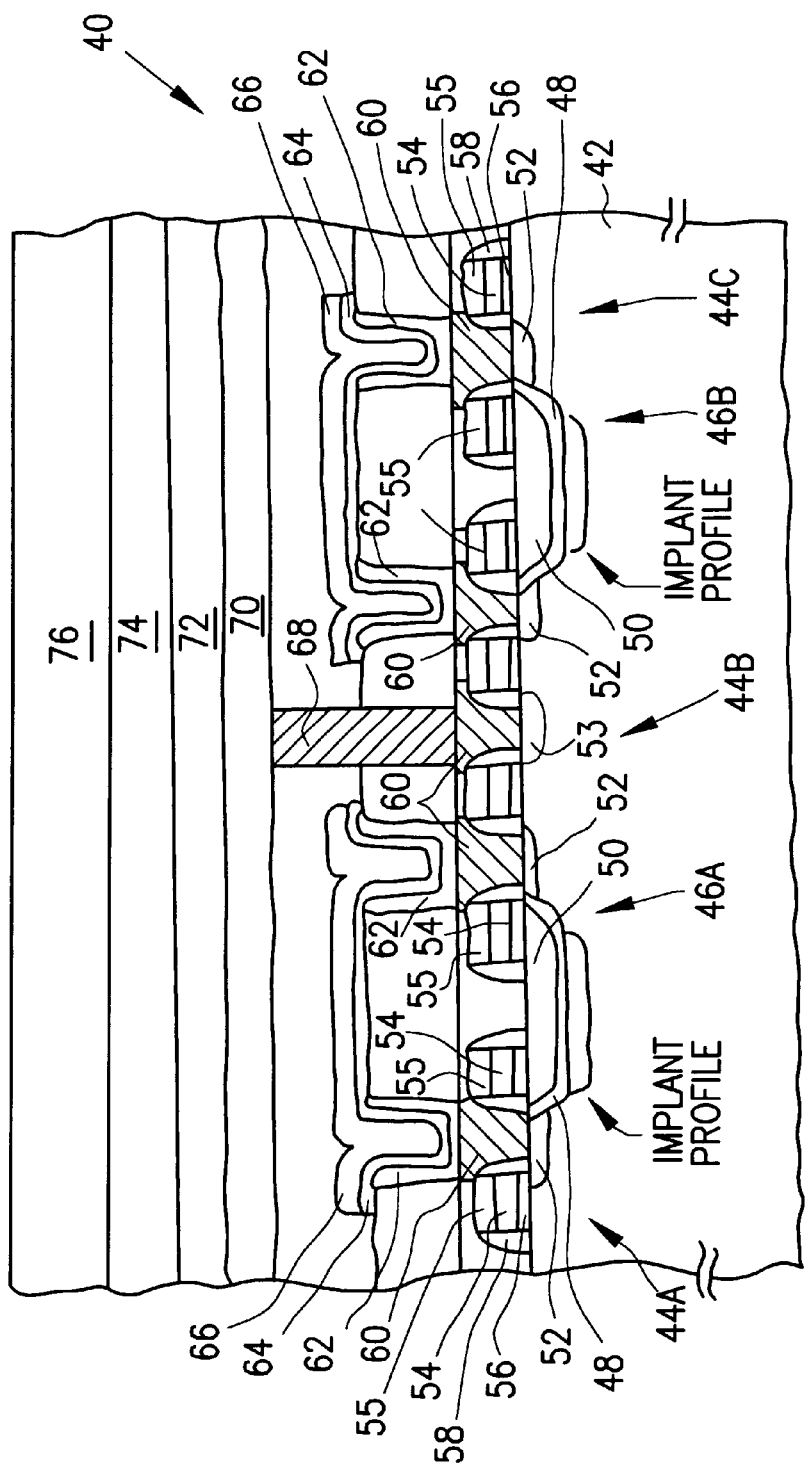
FIG. 9 illustrates an exemplary DRAM incorporating the invention.
Figure 10:
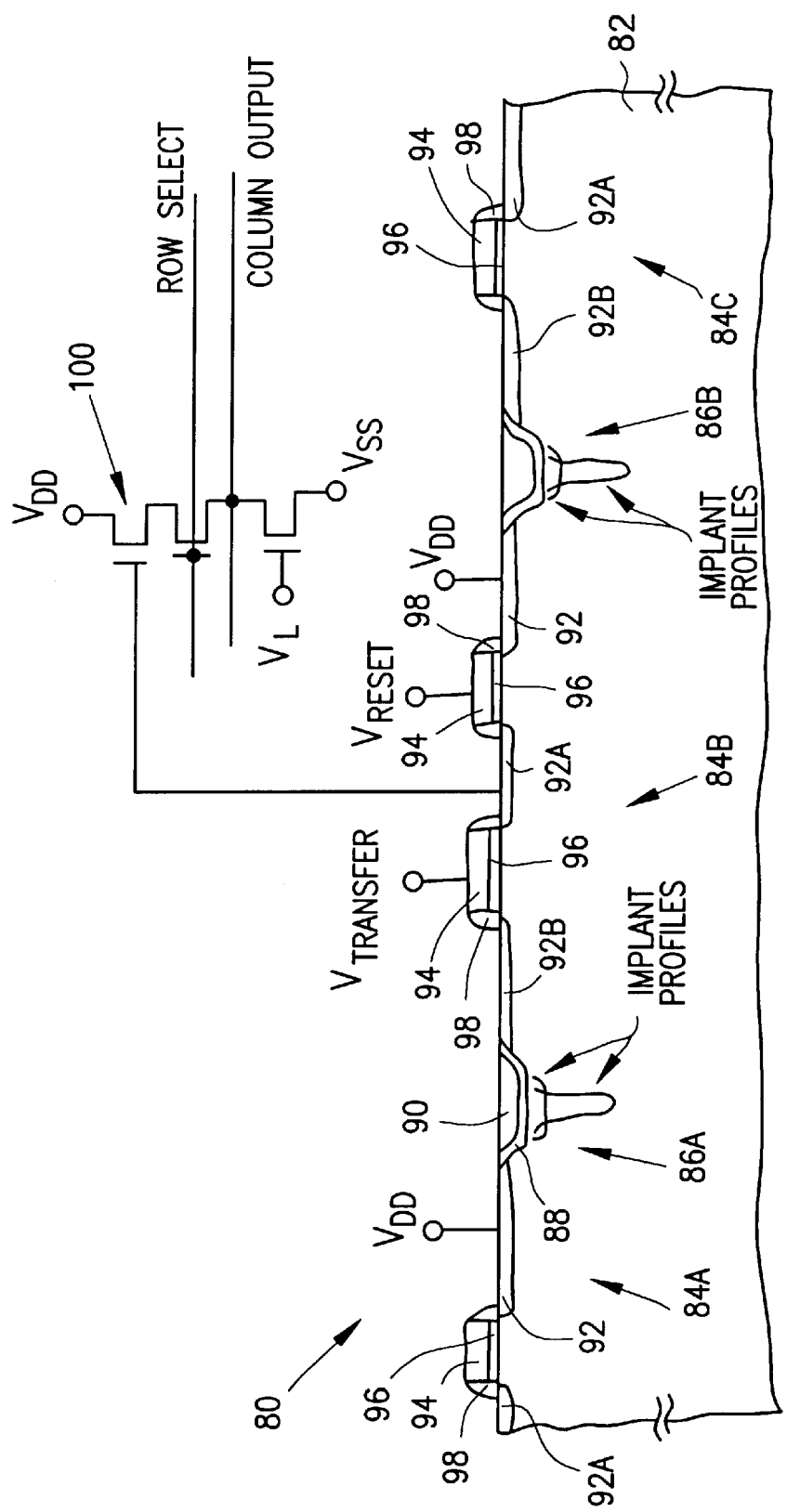
FIG. 10 illustrates an exemplary imager incorporating the invention.

FIGS. 9 and 10 illustrate portions of exemplary integrated circuits which include isolation regions separating active regions. The isolation regions can be formed using the techniques described above.

Referring to FIG. 9, a stacked-cell DRAM 40 includes a semiconductor substrate 42 with multiple active regions 44A, 44B, 44C separated by shallow trench field isolation regions 46A, 46B. Impurity-doped regions 52, 53 can be formed, for example, by a diffusion implanted process with the regions 52 serving as storage nodes for memory cells of the DRAM. Stacked gates are provided over the gate oxide layers 56 with nitride or other spacers 58 provided on either side of the gates. The stacked gates include a polysilicon layer 54 and an insulating layer 55. The insulating layer 55 can include, for example, a deposited oxide, a deposited nitride, or a composite stack of oxide/nitride or oxide/nitride/oxide layers. In some implementations, each gate stack also includes a silicide layer between the polysilicon layer 54 and the insulating layer 55. The silicide layer can include, for example, a tungsten silicide, a titanium silicide or a cobalt silicide. In yet other implementations, the gate stack includes a barrier metal layer and a metal layer between the polysilicon layer 54 and the insulating layer 55. Suitable barrier metal layers include tungsten nitride, titanium nitride and tantalum nitride. The metal layer can include tungsten, tungsten silicide, titanium silicide, or cobalt silicide. Polysilicon plugs 60 form the contacts to the drain and source regions 52.

Each isolation region 46A, 46B includes dielectric layers 48, 50 which are formed when the isolation trenches are partially and completely filled, respectively. Ion implanted regions are provided in the substrate 42 directly below the dielectric layer 48 and are formed according to the techniques described above. The ions implanted beneath the dielectric layer are displaced from the active regions by a distance approximately equal to the sidewall thickness of the dielectric layer 48. In some embodiments, that distance is at least about 100 Å.

In the illustrated integrated circuit of FIG. 9, capacitor cells comprise lower storage node electrodes 62, a cell dielectric 64 and an upper electrode 66. A metal contact 68 provides the electrical connection between one of the plugs 60 which serves as the bit line and a first metallization layer 70. An insulating layer 72 separates the first metallization layer 70 from a second metallization layer 74. The entire semiconductor wafer is covered by a passivation layer 76.

Although FIG. 9 illustrates a stacked-cell DRAM, isolation regions formed according to the techniques described above can be incorporated into any other type of memory such as trench cell DRAMs, flash memory, embedded memory, electrically erasable programmable read only memory (EEPROM), and the like.

Referring now to FIG. 10, a photodiode type of CMOS imager 80 includes a semiconductor substrate 82 with multiple active regions 84A, 84B, 84C separated by field isolation regions 86A, 86B. The active regions 84A, 84B, 84C form photosensitive pixels each of which includes impurity-doped regions 92, 92A, 92B. The region 92A serves as a floating diffusion region, and the region 92B serves as a photodiode. The floating diffusion region 92A is electrically connected to the gate of a source follower transistor 100 as shown in FIG. 10.

Polysilicon gates 94, including a transfer gate and a reset gate, are provided over respective gate oxide layers 96 with nitride or other spacers 98 provided on either side of the gates. In some implementations, additional layers are formed over the polysilicon layer 94 to form a gate stack. Thus, a silicide layer or a silicide layer covered by an insulating layer can be provided over the polysilicon gate 94. The silicide layer can include, for example, a tungsten silicide, a titanium silicide or a cobalt silicide, and the insulating layer can include, for example, a deposited oxide, a deposited nitride, or a composite stack of oxide/nitride or oxide/nitride/oxide layers. In yet other implementations, a gate stack is formed by a barrier metal layer and a metal layer provided over the polysilicon layer 94. Optionally, an insulating layer can be provided over the metal layer. Suitable barrier metal layers include tungsten nitride, titanium nitride and tantalum nitride. The metal layer can include tungsten, tungsten silicide, titanium silicide, or cobalt silicide.

Each isolation region 86A, 86B includes dielectric layers 88, 90 which are formed when the isolation trenches are partially and completely filled, respectively. Shallow and deep ion implant regions are provided in the substrate 82 directly below the dielectric layer 88 and are formed according to the techniques described above. The ions implanted beneath the dielectric layer are displaced from the active regions by a distance approximately the sidewall thickness of the dielectric layer 88. In some embodiments, that distance is at least about 100 Å.

Although FIG. 10 illustrates a photodiode type of imager, isolation regions formed according to the techniques described above can be incorporated into photogate, photoconductor imagers and CCD imagers as well.

Other implementations are within the scope of the following claims.

What is claimed is:

1. A method of fabricating an integrated circuit, the method comprising:

forming an isolation trench, having a bottom and sidewalls, in a semiconductor substrate;

partially filling the trench with a dielectric material so that the sidewalls and the bottom of the trench are coated with the dielectric material; and implanting ions into the substrate in regions directly below the isolation trench after partially filling the trench with the dielectric material, such that substantially all the ions implanted below the isolation trench are displaced horizontally from sidewall edges of the trench.

2. The method of claim 1 wherein implanting ions into the substrate includes bombarding the substrate with ions at an energy such that the dielectric material along the sidewalls of the trench serves as a mask that prevents ions from becoming implanted in an area of the substrate directly below the sidewalls.

3. The method of claim 1 further including filling the trench with a dielectric material after the ions are implanted in the substrate below the trenches.

4. The method of claim 1 wherein partially filling the trench includes growing an oxide material.

5. The method of claim 1 wherein partially filling the trench includes growing a layer of silicon dioxide.

6. The method of claim 1 wherein partially filling the trench includes depositing the dielectric material by chemical vapor deposition.

7. The method of claim 1 wherein partially filling the trench includes thermally growing the dielectric material.

8. The method of claim 1 wherein partially filling the trench includes:

thermally growing a dielectric material; and depositing an dielectric material by chemical vapor deposition.

9. The method of claim 1 wherein the dielectric material has a sidewall thickness less than about forty percent the width of the trench.

10. The method of claim 1 wherein the dielectric material has a thickness of at least about one hundred angstroms.

11. The method of claim 1 wherein implanting ions includes implanting ions of a particular type of conductivity into regions of the substrate having the same type of conductivity.

12. The method of claim 1 wherein implanting ions includes performing a shallow implant to establish a field threshold voltage.

13. The method of claim 1 wherein implanting ions includes performing an implant whose depth into the substrate is greater than the thickness of the dielectric material at the bottom of the trench.

14. The method of claim 13 wherein the implant has a depth into the substrate which is in a range of about 10 to 100 percent the depth of the trench.

15. The method of claim 13 wherein the implant has a depth into the substrate which is in a range of about 20 to 80 percent the depth of the trench.

16. The method of claim 1 wherein implanting ions includes:

performing a shallow implant to establish a field threshold voltage; and performing an implant whose depth into the substrate in a range of about 10 to 100 percent of the trench depth.

17. A method of fabricating an integrated circuit having a plurality of active regions separated by field isolation regions, the method comprising:

etching the substrate to form trenches separating the active regions from one another;

partially filling each trench with a first dielectric material so that sidewalls of the trench are covered with the first dielectric;

directing ions at an upper surface of the substrate after partially filling the trenches with the first dielectric material so that ions are implanted in regions of the substrate below the partially-filled trenches, such that substantially all of the ions implanted below the trenches are displaced horizontally from sidewall edges of the trenches; and substantially filling unfilled portions of the trenches with a second dielectric material after the ions are implanted in the substrate below the trenches.

18. The method of claim 17 wherein partially filling each trench with a dielectric material includes forming a dielectric layer whose thickness is substantially conformal.

19. The method of claim 18 wherein forming a dielectric material includes depositing the dielectric material by chemical vapor deposition.

20. The method of claim 18 wherein forming a dielectric material includes thermally growing the dielectric material.

21. The method of claim 18 wherein forming a dielectric material includes:

thermally growing an oxide material; and depositing an oxide material by chemical vapor deposition.

22. The method of claim 17 wherein partially filling each trench with a dielectric material includes forming a dielectric layer over substantially an entire upper surface of the substrate, wherein the dielectric layer has an average thickness in regions above the active regions that is greater than its average thickness in the trenches.

23. The method of claim 22 wherein forming a dielectric material includes depositing a dielectric material by chemical vapor deposition.

24. The method of claim 21 wherein forming a dielectric material includes:

thermally growing an oxide material; and depositing an oxide material by chemical vapor deposition.

25. The method of claim 17 wherein partially filling each trench with a dielectric material includes providing a dielectric material along sidewalls of the trench such that a sidewall thickness of the dielectric material is less than about forty percent the width of the trench.

26. The method of claim 17 wherein partially filling each trench with a dielectric material includes providing a dielectric material having a thickness of at least about one hundred angstroms.

27. The method of claim 17 wherein directing ions at an upper surface includes implanting ions of a particular type of conductivity into regions of the substrate having the same type of conductivity.

28. The method of claim 17 wherein directing ions at an upper surface includes performing a shallow implant to establish a field threshold voltage.

29. The method of claim 17 wherein directing ions at an upper surface includes performing an implant whose depth into the substrate is greater than the thickness of the dielectric material at the bottom of the trench.

30. The method of claim 29 wherein the implant has a depth into the substrate which is in a range of about 10 to 100 percent the depth of the trench.

31. The method of claim 29 wherein the implant has a depth into the substrate which is in a range of about 20 to 80 percent the depth of the trench.

32. The method of claim 17 wherein implanting ions includes:
   performing a shallow implant to establish a field threshold voltage; and
   performing an implant whose depth into the substrate in a range of about 10 to 100 percent of the trench depth.

33. A method of fabricating a device having a plurality of active regions separated by field isolation regions, the method comprising:
   forming impurity-doped regions in the active regions;
   forming isolation trenches in the substrate to separate the active regions from one another;
   partially filling each trench with a dielectric material so that at least sidewalls of the trench are coated with the dielectric;
   implanting ions in regions of the substrate below the trenches after partially filling the trenches with the dielectric material, such that substantially all of the ions implanted below the trenches are displaced horizontally from sidewall edges of the trenches; and
   substantially filling unfilled portions of the trenches with a dielectric material after the ions are implanted in the substrate below the trenches.

34. The method of claim 33 wherein implanting ions includes performing a shallow implant to establish a field threshold voltage.

35. The method of claim 33 wherein implanting ions includes performing an implant whose depth into the substrate is greater than the thickness of dielectric material at the bottom of the trench.

36. The method of claim 35 wherein the implant has a depth into the substrate which is in a range of about 10 to 100 percent the depth of the trench.

37. The method of claim 35 wherein the implant has a depth into the substrate which is in a range of about 20 to 80 percent the depth of the trench.

38. The method of claim 33 wherein implanting ions includes:
   performing a shallow implant to establish a field threshold voltage; and
   performing a deep implant whose depth into the substrate is in the range of about 10 to 100 percent the depth of the trench.

39. The method of claim 33 wherein forming impurity-doped regions in the active regions includes forming storage nodes for a memory device.

40. The method of claim 33 wherein forming impurity-doped regions in the active regions includes forming photosensitive elements for an imaging device.

41. The method of claim 33 wherein forming impurity-doped regions in the active regions includes forming active elements for a logic device.

* * * * *